United States Patent
Ribeiro Do Nascimento et al.

(10) Patent No.: US 10,320,387 B1
(45) Date of Patent: Jun. 11, 2019

(54) STATIC STATE CONTROL OF A DIGITAL LOGIC CIRCUIT WITHIN AN INTEGRATED CIRCUIT DURING LOW POWER MODE

(71) Applicant: NXP USA, INC., Austin, TX (US)

(72) Inventors: Ivan Carlos Ribeiro Do Nascimento, Campinas (BR); Armando Gomes Da Silva, Jr., Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/146,435

(22) Filed: Sep. 28, 2018

(51) Int. Cl.
  *H03K 19/23* (2006.01)
  *H03K 19/08* (2006.01)
  *H03K 19/173* (2006.01)
  *H03K 19/088* (2006.01)

(52) U.S. Cl.
  CPC ....... *H03K 19/0813* (2013.01); *H03K 19/088* (2013.01); *H03K 19/1737* (2013.01)

(58) Field of Classification Search
  CPC ............. H03K 19/0813; H03K 19/088; H03K 19/1737
  USPC .................................. 326/21, 36, 93
  See application file for complete search history.

(56) References Cited

U.S. PATENT DOCUMENTS

| | | | | |
|---|---|---|---|---|
| 6,933,869 | B1* | 8/2005 | Starr | G11C 5/147 341/120 |
| 8,786,307 | B2* | 7/2014 | Jain | H03K 19/00315 326/9 |
| 9,214,924 | B2 | 12/2015 | Priel et al. | |
| 9,941,882 | B1* | 4/2018 | Lewis | H03K 19/00384 |
| 2008/0094092 | A1* | 4/2008 | Goodnow | G01R 31/2856 324/762.01 |
| 2010/0321065 | A1* | 12/2010 | Wada | G11C 19/00 326/93 |
| 2012/0155212 | A1* | 6/2012 | Kodama | G11C 7/1042 365/233.14 |
| 2013/0002297 | A1* | 1/2013 | Jain | H03K 19/00315 326/52 |
| 2013/0120009 | A1* | 5/2013 | Laplanche | G01R 31/2881 324/750.01 |

(Continued)

OTHER PUBLICATIONS

Chakraborty, Ashutosh, et al.; "Analysis and Optimization of NBTI Induced Clock Skew in Gated Clock Trees;" 2009 Design, Automation & Test in Europe Conference & Exhibition; Apr. 20-24, 2009, Nice, France; DOI: 10.1109/DATE.2009.5090675.

(Continued)

*Primary Examiner* — Don P Le

(57) ABSTRACT

An integrated circuit includes a digital logic circuit having a first transistor and a second transistor, a replica circuit having a first transistor and a second transistor which replicate the first transistor and second transistor of the digital logic circuit, and a storage circuit configured to store a static state indicator. The circuit also includes a comparison circuit configured to compare threshold voltages of the first and second transistor of the replica circuit, and having an output coupled to provide the static state indicator to the storage circuit, and a selection circuit configured to provide the state indicator to an input of the digital logic circuit and an input of the replica circuit during a lower power mode and to provide a run mode signal instead of the state indicator to the input of the digital logic signal and the input of the replica circuit during a high power mode.

20 Claims, 5 Drawing Sheets

(56) References Cited

U.S. PATENT DOCUMENTS

2014/0225639 A1* 8/2014 Guo ..................... H03K 3/84
                                                                             326/8

OTHER PUBLICATIONS

Khoshavi, Navid et al.; "Applicability of Power-gating Strategies for Aging Mitigation of CMOS Logic Paths;" IEEE 57th International Midwest Symposium on Circuits and Systems (MWSCAS); Aug. 3-6, 2014, College Station, Texas; DOI: 10.1109/MWSCAS.2014.6908568.
Maricau, E., et al.; "NBTI Model for Analog IC Reliability Simulation;" Electronics Letters vol. 46, Issue 18, Sep. 9, 2010; ISSN: 0013-5194; DOI: 10.1049/el.2010.1.

* cited by examiner

STATIC STATE CONTROL OF A DIGITAL LOGIC CIRCUIT WITHIN AN INTEGRATED CIRCUIT DURING LOW POWER MODE

BACKGROUND

Field

This disclosure relates generally to integrated circuits, and more specifically, to static state control in the integrated circuit during low power mode to address Bias Temperature Instability (BTI) ageing.

Related Art

Reliability of Metal-Oxide-Semiconductor (MOS) transistors becomes more critical as channel length continues to decrease. For these transistors, such as those with tenths of nanometers channel length, there are four common reliability issues, including high current injection (HCI), time dependent dielectric breakdown (TDDB), negative bias temperature instabilities (NBTI), and positive bias temperature instabilities (PBTI). Referring to both NBTI and PBTI, MOS transistors are affect by bias temperature instability (BTI) when they are biased with a direct-current (DC) voltage in their gate without a drain current (without a lateral electric field inside the channel). Generally, PBTI affects NMOS transistor while NBTI affects PMOS transistors.

During BTI stress, charges are trapped in the dielectric of the MOS gate, which makes the absolute value of the threshold voltage (Vth) increase. That is, the Vth of NMOS transistors is increased, and the Vth of PMOS transistors is decreased. Some part of this BTI degradation can be recovered when the stress is removed, therefore, BTI impact is more important during rest periods of a circuit as opposed to switching periods.

For example, FIG. 1 illustrates a clock distribution circuit 100 of an integrated circuit, which includes a chain of series connected inverters 104-114, and a NAND gate 102 which controls the switching of the inverter chain. When the enable signal, EN, at one input of NAND gate 102 is a logic level one, the inverter chain switches in accordance with an oscillating input, OSC, at another input of NAND gate 102. However, when EN is disabled, or a logic level zero, the logic values remain fixed, as illustrated in FIG. 1. That is the output of NAND gate 102 remains a logic level one, the output of inverter 104 remains a logic level zero, the output of inverter 105 remains a logic level one, and so on. Since an inverter is formed by a PMOS in series with an NMOS between power and ground, the PMOS transistor is stressed in those inverters with a 0 at the input (e.g. inverters 105, 107, 109, 111, and 113) while the NMOS transistor is stressed in those inverters with a 1 at the input (e.g. inverters 104, 106, 108, 110, 112, and 114).

The stress on the NMOS transistors result in an extra delay on the falling edge of the output of the inverter, and the stress on the PMOS transistors result in an extra delay on the rising edge of the output of the inverter. This results in deteriorating the clock duty cycle, resulting in errors in those circuits coupled to the output of clock distribution circuit 100. MOS transistors in any logic which becomes static suffer these BTI effects. Therefore, a need exists to balance BTI ageing of transistors so as to reduce failures in an integrated circuit.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a replica circuit is provided which replicates at least a portion of a digital logic circuit which suffers degradation in Vth with ageing due, for example, to BTI effects. This replica circuit, when in a first configuration, is impacted by ageing along with the digital logic circuit it replicates, and can be operated in the first configuration both during run mode (i.e. high power mode) and stop mode (low power mode). This replica circuit is also placed into a second configuration, which allows for Vth measurements to be performed, which is representative of the Vth's in the digital logic circuit. Based on these measurements, the static state of the digital logic circuit when in stop mode is determined to ensure that the Vth degradation due to BTI effects remains balanced within the digital logic circuit. In the example of the clock distribution circuit, this makes all transistors of all stages equally stressed to maintain a balanced duty cycle.

Figure 1:
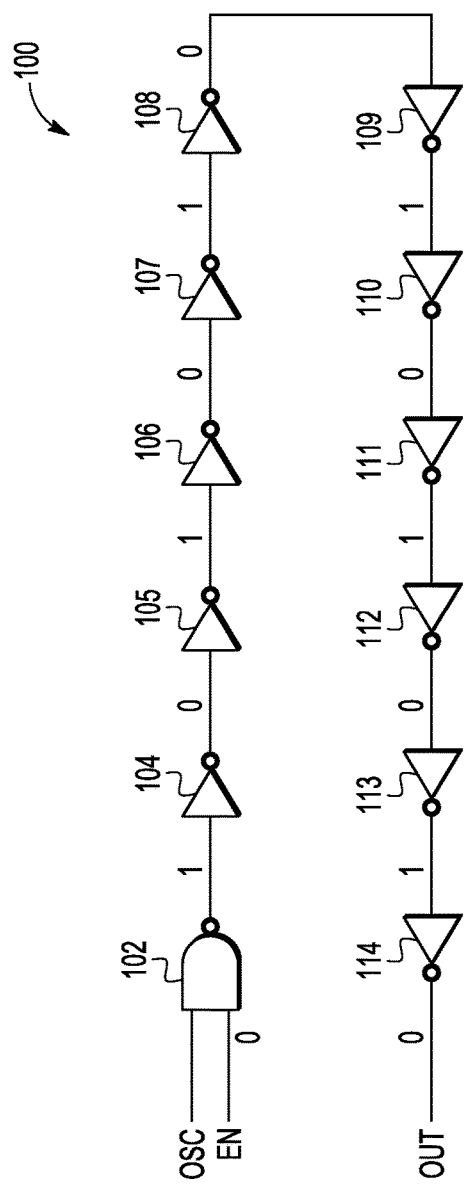
FIG. 1 illustrates a clock distribution circuit in accordance with the prior art.
Figure 2:
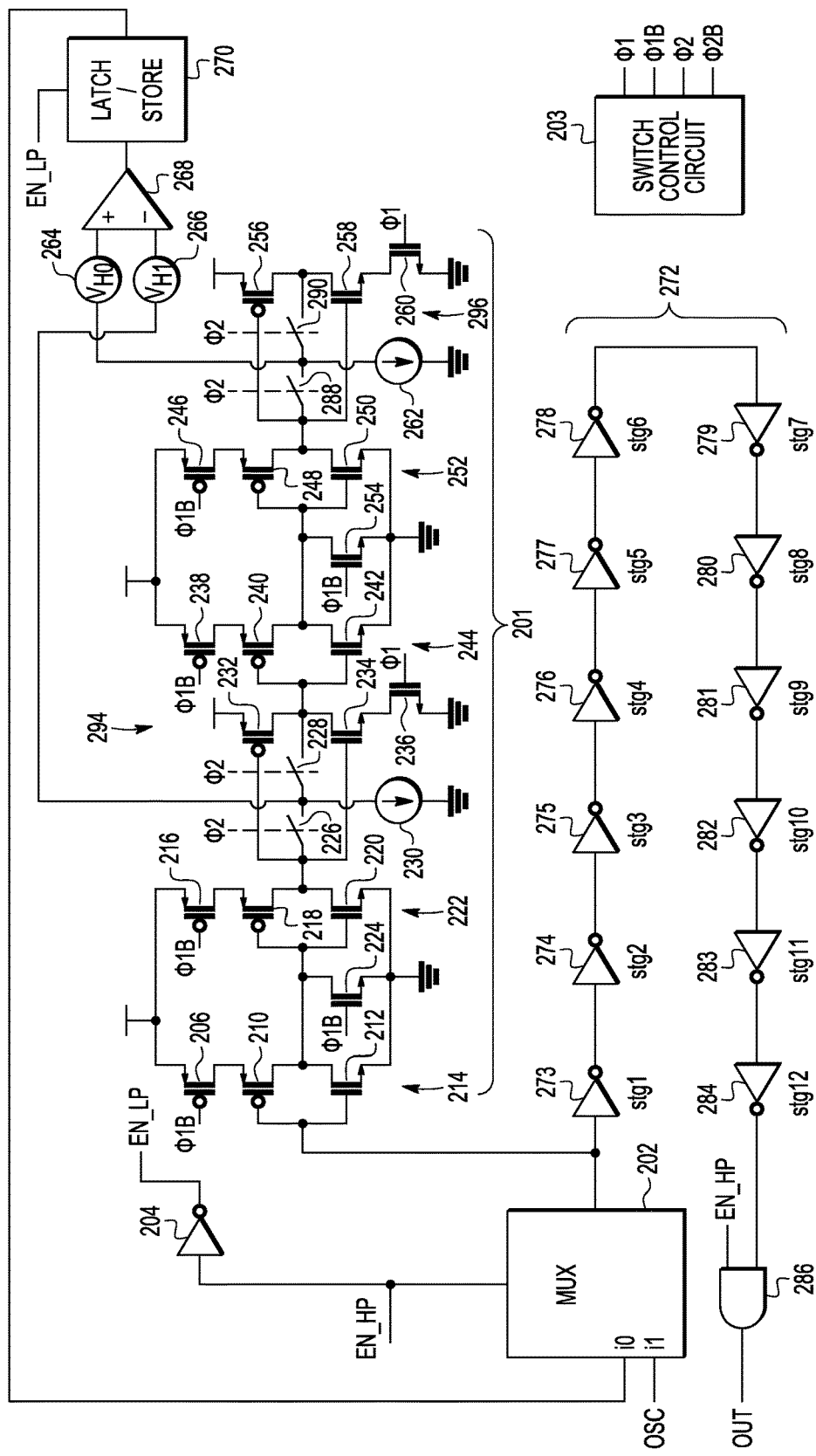
FIG. 2 illustrates a clock distribution circuit in accordance with one embodiment of the present invention.
Figure 6:
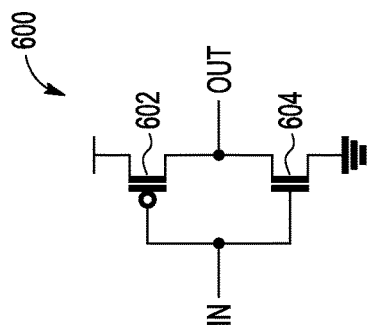
FIG. 6 illustrates, in schematic form, an exemplary inverter of the clock distribution circuit of FIG. 2, in accordance with one embodiment of the present invention.

FIG. 2 illustrates, in partial block diagram and partial schematic form, a clock distribution circuit 200 including a multiplexer (MUX) 202, an inverter 204, switch control circuit 203, a replica circuit 201, a comparator 268, voltage sources 264 and 266, and a latch 270, a chain of inverters 272 (including series-connected inverters 273-284 having 12 stages, stg1-stg12), and a masking AND gate 286. Each inverter in chain 272 includes a PMOS transistor coupled in series with an NMOS transistor, as illustrated, for example, in FIG. 6 with an inverter 600 which includes a PMOS transistor 602 coupled in series with an NMOS transistor 604. An input of inverter 600 is coupled to control electrodes of transistors 602 and 604, a first current electrode of transistor 602 is coupled to a first power supply node (e.g. Vdd), and a second current electrode of transistor 602 provides an output of inverter 600. A first current electrode of transistor 604 is coupled to a second current electrode of transistor 602, and a second current electrode of transistor 202 is coupled to a second power supply node (e.g. Vss or ground). Therefore, each inverter of chain 272 includes a PMOS transistor such as transistor 602 and an NMOS transistor such as transistor 604. Note that the chain of inverters 272 is a digital logic circuit which becomes static during low power modes and thus suffer from BTI effects. However, the chain of inverters 272 is only one example of such a digital logic circuit, and the descriptions which follow of MUX 202, replica circuit 201, comparator 268, voltage sources 264 and 266, and latch 270 can be used to mitigate the BTI effects of any digital logic circuit which would otherwise become static during low power or stop modes.

Still referring to FIG. 2, replica circuit 201 includes switches 206, 216, 224, 226, 228, 236, 238, 246, 242, 254, 288, 290, and 260. Each of these switches has a first terminal, a second terminal, and a control input. When the control input is in a first state (indicative of a closed switch), the switch is "on" or in a conductive state in which the first and second terminals are connected, providing a short circuit between the terminals. When the control input is in a second state (indicative of an open switch), the switch is "off" or in a non-conductive state in which the first and second terminals are disconnected, providing an open circuit between the terminals. These switches can be implemented, for example, with MOS transistors in which the first and second terminals correspond to the current electrodes of the MOS transistor and the control input corresponds to the gate electrode of the MOS transistor. Switches 236 and 260 receive Φ1 at the control inputs, switches 206, 216, 224, 238, 246, and 254 receive the inverse of Φ1, Φ1B, at the control inputs, and switches 226, 228, 288, and 290 receive Φ2 at the control inputs. Switch control circuit 203 provides the values for each of switch control inputs Φ1, Φ1B, Φ2, and Φ2B. Replica circuit 202 also includes PMOS transistors 210, 218, 232, 240, 248, and 256, and NMOS transistors 212, 222, 234, 242, 250, and 258. PMOS transistor 232 is also referred to as MPa1, NMOS transistor 234 as MNa1, PMOS transistor 256 and MPa1, and transistor 258 as MNa2. Switches 206 216, 238, and 246 are also referred to as PMOS transistors or transistors, and switches 224, 254, and 260 are also referred to as NMOS transistors or transistors.

Within replica circuit 201, a first current electrode of transistor 206 is coupled to the first power supply node. A first current electrode of transistor 210 is coupled to a second current electrode of transistor 206. A first current electrode of transistors 212 is coupled to a second current electrode of transistor 210, and a second current electrode is coupled the second power supply node. A first current electrode of transistor 216 is coupled to the first power supply node. A first current electrode of transistor 218 is coupled to a second current electrode of transistor 216. A first current electrode of transistors 220 is coupled to a second current electrode of transistor 218, and a second current electrode is coupled the second power supply node. A first current electrode of transistor 224 is coupled to the second current electrode of transistor 210, the first current electrode of transistor 212, and the control electrodes of transistors 218 and 220. A second current electrode of transistor 224 is coupled to the second power supply node. A control electrode of transistors 206, 216, and 224 are coupled to receive Φ1B.

A first terminal of switch 226 is coupled to a second current electrode of transistor 218 and the first current electrode of transistor 220, and a second terminal of switch 226 is coupled to a first terminal of a current source 230. A second terminal of current source 230 is coupled to the second supply node. A first terminal of switch 228 is coupled to the first terminal of current source 230. Control inputs of switches 226 and 228 are coupled to receive Φ2. The first terminal of current source 230 is coupled to a negative terminal of voltage source 266. A first current electrode of transistor 232 is coupled to the first power supply node, a control electrode of transistor 232 is coupled to the first terminal of switch 226, and a second current electrode of transistor 232 is coupled to a second terminal of switch 228. A first current electrode of transistor 234 is coupled to the second current electrode of transistor 232, a control electrode of transistor 234 is coupled to the first terminal of switch 226, and a second current electrode of transistor 234 is coupled to a first current electrode of transistor 236. A second current electrode of transistor 236 is coupled to the second supply node. A control electrode of transistor 236 is coupled to receive Φ1.

Continuing with replica circuit 201, a first current electrode of transistor 238 is coupled to the first power supply node. A first current electrode of transistor 240 is coupled to a second current electrode of transistor 238. A first current electrode of transistor 242 is coupled to a second current electrode of transistor 240, and a second current electrode is coupled the second power supply node. A first current electrode of transistor 246 is coupled to the first power supply node. A first current electrode of transistor 248 is coupled to a second current electrode of transistor 246. A first current electrode of transistor 250 is coupled to a second current electrode of transistor 248, and a second current electrode is coupled the second power supply node. A first current electrode of transistor 254 is coupled to the second current electrode of transistor 240, the first current electrode of transistor 242, and the control electrodes of transistors 248 and 250. A second current electrode of transistor 254 is coupled to the second power supply node. A control electrode of transistors 238, 246, and 254 are coupled to receive Φ1B.

A first terminal of switch 288 is coupled to a second current electrode of transistor 248 and the first current electrode of transistor 250, and a second terminal of switch 288 is coupled to a first terminal of a current source 262. A second terminal of current source 262 is coupled to the second supply node. A first terminal of switch 290 is coupled to the first terminal of current source 262. Control inputs of switches 288 and 290 are coupled to receive Φ2. The first terminal of current source 262 is coupled to a negative terminal of voltage source 264. A first current electrode of transistor 256 is coupled to the first power supply node, a control electrode of transistor 256 is coupled to the first terminal of switch 288, and a second current electrode of transistor 256 is coupled to a second terminal of switch 290. A first current electrode of transistor 258 is coupled to the second current electrode of transistor 256, a control electrode of transistor 258 is coupled to the first terminal of switch 288, and a second current electrode of transistor 258 is coupled to a first current electrode of transistor 260. A second current electrode of transistor 260 is coupled to the second supply node. A control electrode of transistor 260 is coupled to receive Φ1.

Continuing with FIG. 2, a positive terminal of voltage source 264 is coupled to a non-inverting input of comparator 268, and a positive terminal of voltage source 266 is coupled to an inverting input of comparator 268. Comparator 268 may also be referred to as a comparison circuit. Voltage source 264 provides a hysteresis voltage of $V_{H0}$, and voltage source 266 provides a hysteresis voltage of $V_{H1}$. An output of comparator 268 is provided as an input to latch 270. MUX 202 has a first data input i0, a second data input i1, a data output, and a control input which allows selection between i0 and i1 to be provided at the data output. When the control input receives a logic level zero, i0 is selected as the output of MUX 202, when the control input receives a logic level one, i1 is selected as the output of MUX 202. The control input of MUX 202 and an input of inverter 204 are coupled to receive a high power mode enable, EN_HP, which enables operation in normal, or high power, mode when asserted. An output of inverter 204 provides a low power mode enable, EN_LP, which, when asserted, enables operation in a low power mode and enables latch 270 to store the output of comparator 268. An output of latch 270, referred to as a static state indicator, is provided to input i0 of MUX 202. A high frequency clock, OSC, used during run mode or high power mode, is provided to input i1 of MUX 202. When in run mode, i1 is provided to the input of inverter chain 272, and when in stop mode, i0 is provided to the input of inverter chain 272. The output of MUX 202 is also coupled to the control electrodes of transistors 210 and 212, which corresponding to an input of replica circuit 201.

In operation, when in a high power mode or run mode, EN_HP is asserted, selecting OSC (at i1) to be provided by MUX 202 to chain of inverters 272. The output of chain 272 is provided as OUT via AND gate 286. Since EN_HP is at a logic level one when in high power mode, the output of inverter 286 is provided as OUT, unmasked. The output of chain 272 distributes the OSC clock at its frequency to other circuits of the integrated circuit coupled to receive OUT. During high power mode, note that the OSC clock is also provided to the input of replica circuit 201. Replica circuit 201 includes circuit elements which replicate elements in chain of inverters 272. In the case of other digital logic circuits other than chain of inverters 272, replica circuit 201 would include circuit elements which replicate one or more elements of the digital logic circuit which are susceptible to BTI effects, and thus Vth degeneration. In the case of replica circuit 201, transistors 232 and 234 (i.e. MPa1 and MNa1, respectively) form an inverter 294 which replicates inverter 273 (i.e. stg1) of chain 272. Similarly, transistors 256 and 258 (i.e. MPa2 and MNa2, respectively) form a inverter 296 which replicates inverter 274 (i.e. stg2) of chain 272.

As will be described further in reference to FIGS. 3 and 4, replica circuit 201 may be configured into two different configurations, a first configuration, referred to as an ageing configuration, and a second configuration, referred to as an evaluation configuration, based on the values of Φ1 and Φ2. During the ageing configuration, replica circuit 201, and in particular, replica inverters 294 and 296, experience ageing just as inverters 273 and 272 do, which is representative of the ageing of chain of inverters 272. Note that transistors 210 and 212 form an inverter 214, transistors 218 and 220 form an inverter 222, transistors 240 and 242 form an inverter 244 and transistors 248 and 250 form an inverter 252. Inverters 214, 222, 244, and 252 ensure, during the ageing configuration, that replica inverters 294 and 296 experience the same inputs and thus the same stress as inverters 273 and 274. These inverters can also be decoupled from replica inverters 294 and 296 during the evaluation phase. During the evaluation phase, the gate-to-source voltages (indicative of the threshold voltages) of replica inverters 294 and 296 are compared to determine the state of latch 270 and thus the static state of the stages of chain 272 during stop mode.

Figure 3:
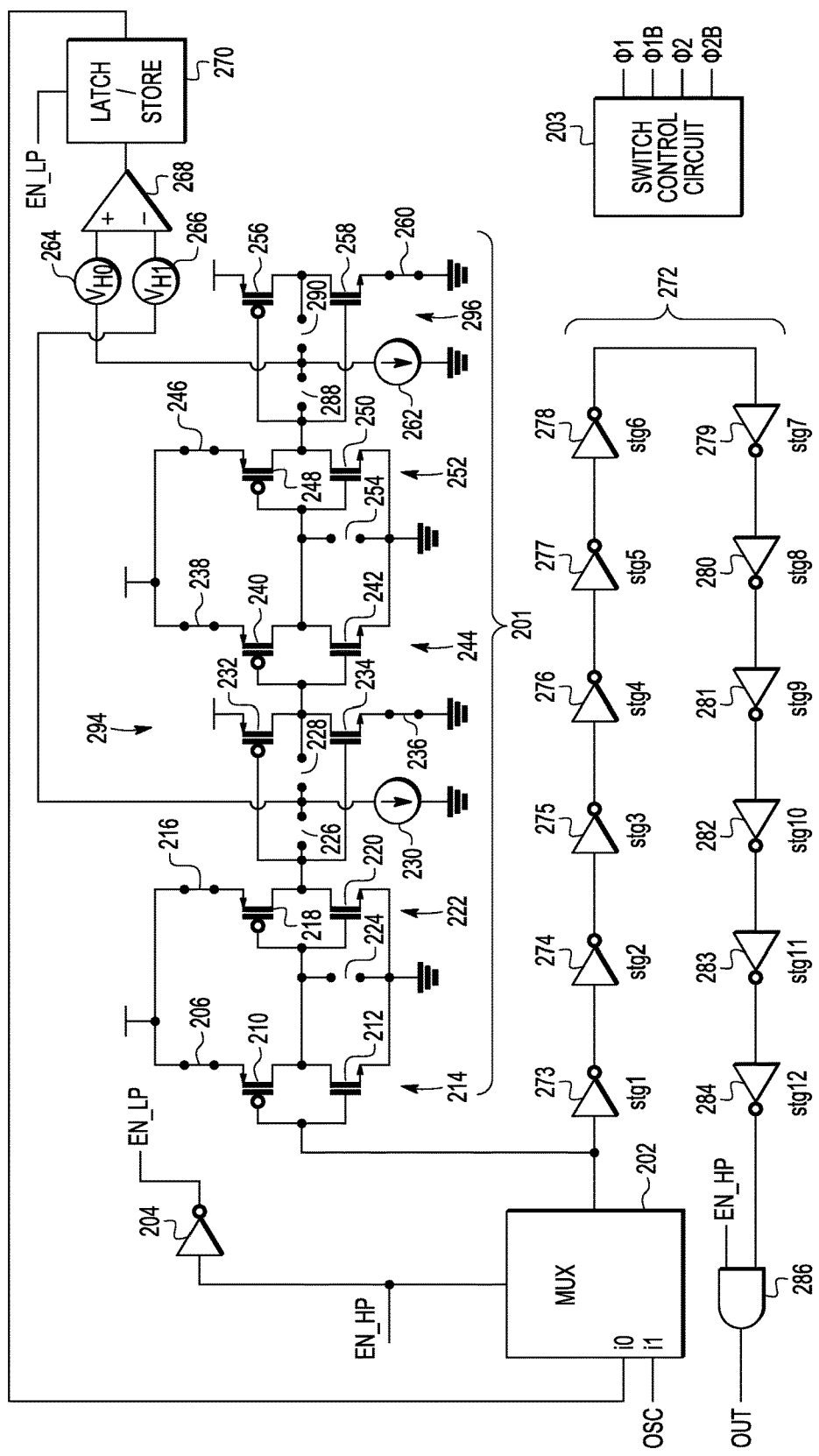
FIGS. 3 and 4 illustrate the clock distribution circuit of FIG. 2 with switches in a first and second configuration, respectively.

FIG. 3 illustrates, in partial block diagram and partial schematic form, clock distribution circuit 200 in the first configuration, i.e. the ageing configuration. For this configuration, switch control circuit 203 asserts Φ1 to a logic level one and deasserts Φ2 to a logic level zero. As a result, Φ1B is set to a logic level zero and Φ2B is set to a logic level one. Therefore, referring to FIG. 3, switches 206, 216, 238, 246, 236, and 260 are closed, and switches 224 and 254 are open. In FIGS. 3 and 4, closed switches are illustrated as simply a solid line between its terminal (hence a "short"), and open switches are illustrated as a blank space between its terminals (hence an "open"). Also, switches 226, 228, 288, and 290 are open, which decouples replica circuit 201 from current sources 230 and 262 and from comparator 268. The switches being in this first configuration allows inverters 214, 222, 244 and 252 to be properly powered and properly coupled to provide the same inputs to inverters 294 and 296 as provided to inverters 273 and 274, respectively. In this manner, these transistors of inverters 294 and 296 are stressed (or relaxed) just as the transistors of inverters 273 and 274.

For example, when circuit 200 is in stop mode, the output of MUX 202 is provided to both inverters 273 and the input of replica circuit 201. Assuming the latched value in latch 270 is a logic level zero, then during stop mode, the zero is provided as an input to inverter 273 and inverter 214. Inverter 214 provides a logic level one to inverter 222 which provides a logic level zero to inverter 294. In this manner, the PMOS transistor of inverter 273 (e.g. transistor 602 of inverter 273) is stressed, as is the PMOS transistor (MPa1) of inverter 294. These stressed PMOS transistors will suffer ageing with increasing |Vth|. Also, at this time, the NMOS transistor of inverter 273 (e.g. transistor 604 of inverter 273) is not stressed, and neither is the NMOS transistor (MNa1) of inverter 294. Continuing with this example, inverter 273 provides a logic level one to inverter 274, and inverters 244 and 252 also provide a logic level one to inverter 296. In this manner, the NMOS transistor of inverter 274 (e.g. transistor 604 of inverter 274) is stressed, as is the NMOS transistor (MNa2) of inverter 296. These stressed NMOS transistors will suffer ageing with increasing |Vth|. Also, at this time, the PMOS transistor of inverter 274 (e.g. transistor 602 of inverter 274) is not stressed, and neither is the PMOS transistor (MPs2) of inverter 296. Note that during lower power mode or stop mode, EN_HP is deasserted to a logic level zero, and therefore AND gate 286 masks the output of inverter 284, providing a logic level zero as OUT. In this manner, any toggling of inverter 284 during stop mode is masked.

Each time latch 270 changes states, the transistors which were under ageing stress in the previous state are relaxed in the current state, and those that were relaxed in the previous state are now stressed in the current state. Therefore, in the first configuration with latch 270 in a first state, a first set of transistors of the digital logic circuit (e.g. chain of inverters 272) is stressed during stop mode while a second set of transistors of the digital logic circuit relaxes during stop mode. Similarly, in the first configuration with latch 270 in a second state, the first set of transistors relaxes during stop mode while the second set of transistors is stressed during stop mode. It is desirable to maintain replica circuit 201 as long as possible in the ageing configuration since this will keep replica circuit 201 under the same or very similar ageing effects as the digital logic circuit (e.g. chain of inverters 272). Note that latch 270 can be any storage circuit configured to store the static state indicator which sets the static state of the digital logic circuit during stop mode.

Figure 4:
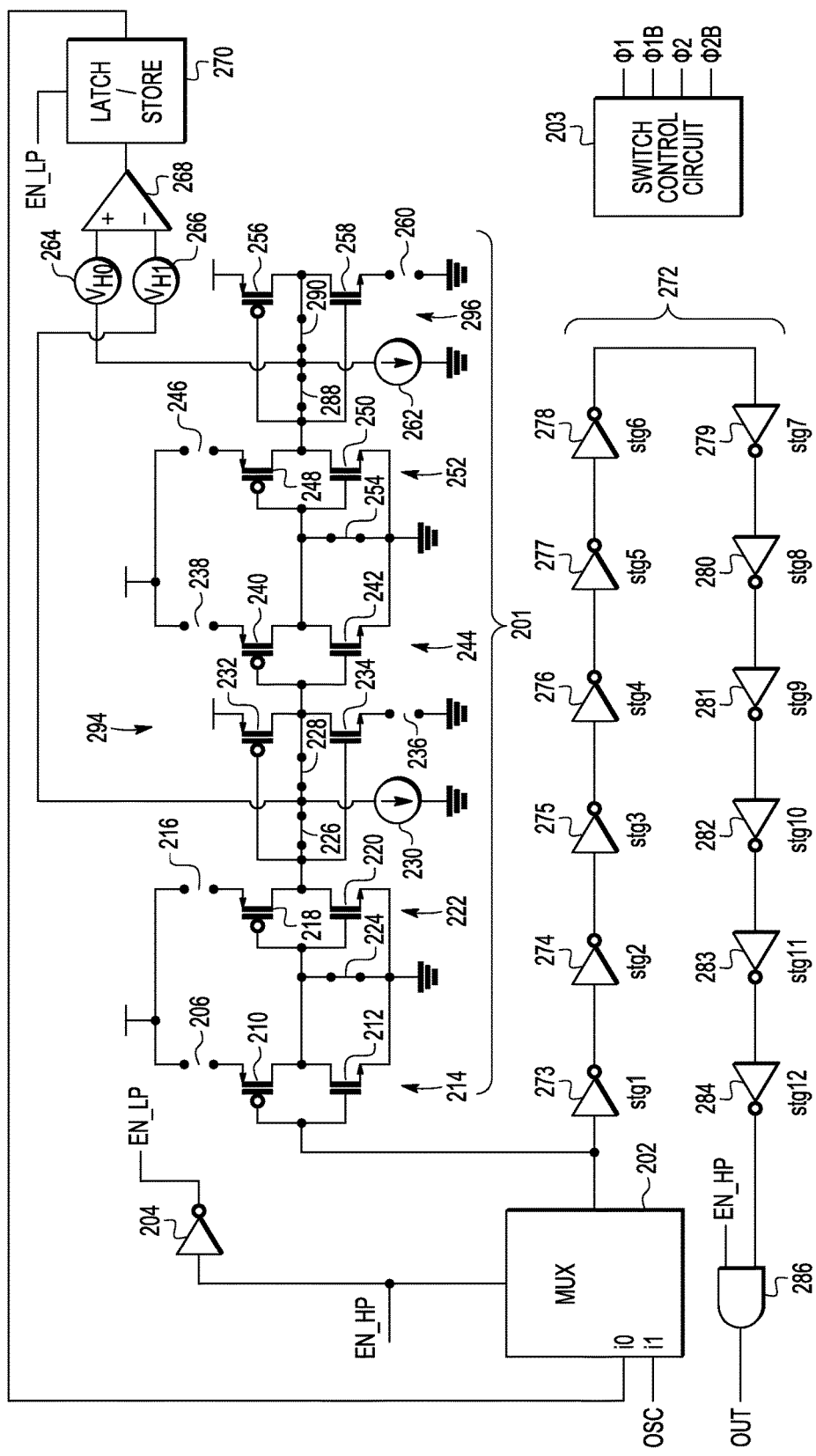

FIG. 4 illustrates, in partial block diagram form and partial schematic form, clock distribution circuit 200 in the second configuration, i.e. the evaluation configuration. For this configuration, switch control circuit 203 asserts Φ2 to a logic level one and deasserts Φ1 to a logic level zero. As a result, Φ2B is set to a logic level zero and Φ1B is set to a logic level one. Therefore, referring to FIG. 4, switches 244, 226, 228, 254, 288, and 290 are closed, and switches 206, 216, 236, 238, 246, and 260 are open. With the switches in this configuration, power is removed from inverters 214, 222, 244, and 252, and the inverters are thus decoupled from affecting inverters 294 and 296. Also, with switches 226 and 228 closed, control electrode (gate) of MPa1 is connected to the second current electrode (source) of MPa1 and to the first terminal of current source 230. With switches 288 and 290 closed, the control electrode (gate) of MPa2 is connected to the second current electrode (source) of MPa2 and to the first terminal of current source 262. In this manner, the gate-to-source voltage (Vgs) of MPa1 can be compared to the Vgs of MPa2, in which the Vgs corresponds to the Vth of the transistor.

While the circuit is in the ageing configuration with latch 270 outputting a logic level zero, MPa1 suffers ageing in which eventually, after some ageing, the |Vgs| (and thus |Vth|) of MPa1 becomes greater than the|Vgs| (and thus |Vth|) of MPa2 by a threshold voltage amount. Therefore, when the circuit is placed in run mode, the circuit is first placed in the evaluation configuration, and if |Vgs| of MPa1 is greater than |Vgs| of MPa2, as determined by comparator 268, the value of latch 270 is changes from a logic level zero to a logic level one. The circuit is then returned to the ageing configuration in which, eventually, the |Vgs| of MPa2 will become greater than the |Vgs| of MPa1 by a predetermined amount. During a subsequent evaluation configuration, this change will be detected by comparator 268 which will cause the state of latch 270 to change back to a logic level zero.

Replica circuit 201 may also include hysteresis to avoid changing the state of latch 270 too frequently and to be more robust to noise. In the embodiment of FIGS. 2-4, this hysteresis is provided by voltage sources 264 and 266. For example, this requires that the |Vgs| of one PMOS transistor surpasses the other by the threshold voltage amount, which is set by $V_{HO}$ and $V_{H1}$. This hysteresis can also be implemented within comparator 268 rather than with voltage sources coupled in series with the PMOS transistors as in FIGS. 2-4. Therefore, when referring to comparator 268 (or comparison circuit 268), the comparator may be implemented with or without hysteresis, where the hysteresis can be provided with voltage sources on the inputs of the comparator or within the comparator itself.

Figure 5:
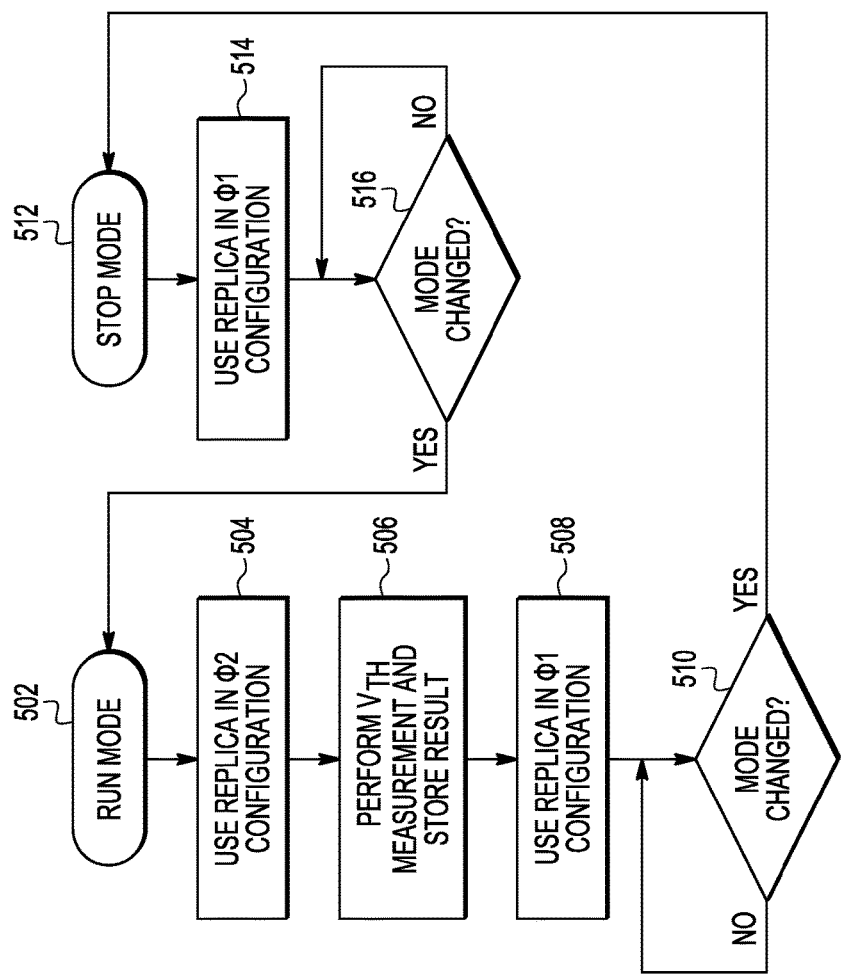
FIG. 5 illustrates, in flow diagram form, operation of the clock distribution circuit of FIG. 2, in accordance with one embodiment of the present invention.

FIG. 5 illustrates, in flow chart form, a method 500 for operating an integrated circuit with a digital logic circuit and a corresponding replica circuit, in accordance with one embodiment of the present invention. Method 500 applies to clock distribution circuit 200 but also applies to any other digital logic circuit which has a corresponding replica circuit which replicates devices or transistors of all or a portion of the digital logic circuit such that the replica circuit exhibits the same or similar stress as the digital logic circuit. Preferably, the replica circuit includes a first transistor and a second transistor which correspond to a first transistor and second transistor of the digital logic circuit in which, in the ageing configuration, the first transistors experience stress with one logic state of the shared input to the replica circuit and digital logic circuit while the second transistors relax, and the second transistors exhibit stress with the other logic state of the shared input while the first transistors relax. Furthermore, the first transistors are designed and sized to match each other and the second transistors are designed and sized to match each other. In this manner, the first and second transistors of the replica circuit replicate the degradation experienced by the corresponding first and second transistors of the digital logic circuit. Note that, in one embodiment, MPa1 and MPa2 are required to match each other while other transistors are not.

Also, depending on the type of digital logic circuit being replicated, the second input of MUX 202 (i1) can be coupled to receive any run mode signal and is not limited to a clock signal such as OSC. Typically, the run mode signal would be a signal which, during high power mode, changes state fairly frequently and not remain static and which, during low power mode, remains static. In alternate embodiments, MUX 202 can be any type of selection circuit which selects and provides the static state indicator during low power mode and the run mode signal during high power mode.

Referring back to FIG. 5, when method 500 enters run mode (i.e. full power mode) of the integrated circuit, the replica circuit (such as replica circuit 201) is placed in the evaluation configuration in block 504, and the Vth measurements are performed in block 506. As described above, the measurements may include comparing the Vgs values of two PMOS transistors of the replica circuit, and the result is stored as the static state indicator, such as in latch 270. This result can be stored in any type of storage circuitry which is capable of providing this value as an input to both the replica circuit and digital logic circuit when configured in the ageing configuration in stop mode or low power mode. After the measurements are taken and stored, the replica circuit (such has replica circuit 201) is placed in the ageing configuration in block 508. The integrated circuit continues to run in decision diamond 510 until a mode change occurs, and the integrated circuit enters stop mode in block 512. In stop mode, the replica circuit is used in the ageing configuration, in which the stored value (from block 506, such as in latch 270), is used as the input to both the replica circuit and the digital logic circuit. This configuration remains in decision diamond 516 until a mode change occurs and the integrated circuit again enters run mode in block 512. That is, the integrated circuit operates, as needed, between run and stop modes.

Note that the replica circuit, such as replica circuit 201, may be used either in stop or run mode. Since the replica circuit includes isolation or decoupling circuitry to isolate the transistors being measured during the evaluation phase, the digital logic circuit can continue operating in either stop or run mode. Therefore, in an alternate embodiment, method 500 can include placing the replica circuit in the evaluation phase upon entering stop mode rather than upon entering run mode. (For example, in the embodiment of FIGS. 2-4, this isolation circuitry may include inverters 214, 222, 244, and 252, along with switches coupled between these inverters and the power supply nodes, which allows these inverters to be decoupled from the transistors of replica circuit 201 being measured or compared.) Also, method 500 applies to clock distribution circuit 200 but can apply to any digital logic which becomes static during operation such as to make BTI effects significant. The balancing provided by method 500 will allow the threshold voltages to remain close between transistors of even and odd gates, and will not be sensitive to temperature or supply voltage variations across time since the effect of ageing on the threshold voltage is being directly controlled by the replica circuit.

Therefore, by now it can be understood how a replica circuit, which replicates at least a portion of a digital logic circuit which suffers degradation in Vth with ageing due, for example, to BTI effects, can help balance the ageing to provide improved operation of the integrated circuit. This replica circuit, in a first configuration, is impacted by ageing along with the digital logic circuit it replicates, and can be operated in the first configuration both during run mode (i.e. high power mode) and stop mode (low power mode). This replica circuit, in a second configuration, allows for Vth measurements to be performed, which is representative of the Vth's in the digital logic circuit. The measurements can be made either in run or stop mode, and based on these measurements, the static state of the digital logic circuit when in stop mode is determined to ensure that the Vth degradation remains balanced within the digital logic circuit. In this manner, the effects of BTI stress in digital logic circuits within an integrated circuit can be mitigated and allow for improved circuit operation, even as the integrated circuit ages.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a "b" following the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the MUX, VLF clock, and counter may be used mitigate and balance BTI stress effects in any logic circuit and not only clock distribution circuits. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a digital logic circuit having a first transistor and a second transistor; a replica circuit having a first transistor and a second transistor which replicate the first transistor and second transistor of the digital logic circuit; a storage circuit configured to store a static state indicator; a comparison circuit configured to compare threshold voltages of the first and second transistor of the replica circuit, and having an output coupled to provide the static state indicator to the storage circuit; and a selection circuit configured to provide the state indicator to an input of the digital logic circuit and an input of the replica circuit during a lower power mode and to provide a run mode signal instead of the state indicator to the input of the digital logic signal and the input of the replica circuit during a high power mode. In one aspect of this embodiment, the replica circuit is configured to operate in an evaluation configuration and an ageing configuration, wherein when in the evaluation configuration, the first and second transistor are isolated from the input of the replica circuit and the comparison circuit compares the threshold voltages of the first and second transistors. In a further aspect, when the replica circuit is in the evaluation configuration and the threshold voltage of the first transistor is greater than the threshold voltage of the second transistor, the static state indicator is set to a first logic value, and when the replica circuit is in the evaluation configuration and the threshold voltage of the first transistor is not greater than the threshold voltage of the second transistor, the static state indicator is set to a second logic value. In another further aspect, when the replica circuit is in the ageing configuration, the replica circuit provides a first same input to control electrodes of both the first transistor of the digital logic circuit and the first transistor of the replica circuit and provides a second same input to control electrodes of both the second transistor of the digital logic circuit and the second transistor of the replica circuit. In yet a further aspect, when the replica circuit is in the ageing configuration, the first transistor and second transistor of the replica circuit are decoupled from the comparison circuit. In another yet further aspect, when the replica circuit is in the ageing configuration during the low power mode: the first transistor of the replica circuit and the first transistor of the digital logic circuit experience stress if the static state indicator has a first logic value and are relaxed if the static state indicator has a second logic value, different from the first logic value, and the second transistor of the replica circuit and the second transistor of the digital logic circuit experience stress if the static state indicator has the second logic value, and are relaxed if the static state indicator has the first logic value.

In another embodiment, an integrated circuit includes a digital logic circuit having a first transistor and a second transistor; a replica circuit having a first transistor and a second transistor which replicate the first transistor and second transistor of the digital logic circuit, and a plurality of switches, wherein the replica circuit is configured into an evaluation configuration when the plurality of switches are in a first configuration and an ageing configuration when the plurality of switches are in a second configuration; a storage circuit configured to store a static state indicator; a comparison circuit having a first input coupled to the first transistor of the replica circuit, a second input coupled to the second transistor of the replica circuit, and an output coupled to provide the static state indicator to the storage circuit; and a multiplexer (MUX) having a first data input, a second data input, a control input, and an output, wherein the output is coupled to an input of the digital logic circuit and an input of the replica circuit, the first data input signal is coupled to receive the static state indicator and the second data input is coupled to receive a clock signal, wherein the MUX is configured to provide the first data input as the output of the MUX during a low power mode and to provide the second data input as the output of the MUX during a high power mode. In one aspect of the another embodiment, the digital logic circuit comprises a chain of series-connected inverters, wherein a first inverter of the series-connected inverters includes the first transistor of the digital logic circuit and a second inverter of the series-connected inverters includes the second transistor of the digital logic circuit, and the replica circuit includes a first inverter which includes the first transistor of the replica circuit and a second inverter which includes the second transistor of the replica circuit. In a further aspect, the output of the MUX is coupled to an input of the first inverter of the digital logic circuit, and an output of the first inverter of the digital logic circuit is coupled to an input of the second inverter of the digital logic circuit. In yet a further aspect, in the ageing configuration, the first inverter of the replica circuit is coupled to receive a first same value as the first inverter of the digital logic circuit, and the second inverter of the replica circuit is coupled to receive a same second value as the second inverter of the digital logic circuit. In yet further aspect, in the ageing configuration, the replica circuit further includes a third inverter and a fourth inverter, coupled in series, between the input of the replica circuit and the input of the first inverter of the replica circuit; and a fifth and sixth inverter, coupled in series, between an output of the first inverter of the replica circuit and an input of the second inverter of the replica circuit. In yet an even further aspect, in the evaluation configuration, the third and fourth inverters are decoupled from the first inverter of the replica circuit, and the fifth and sixth inverters are decoupled from the second inverter of the replica circuit, and in the ageing configuration, the comparison circuit is decoupled from the first and second transistor of the replica circuit. In another aspect of the another embodiment, in the evaluation configuration, the comparison circuit is configured to compare gate-to-source voltages of the first and second transistor of the replica circuit, and provide a result of the comparison as the static state indicator in the storage circuit. In a further aspect, when the replica circuit is in the evaluation configuration and the gate-to-source voltage of the first transistor is greater than the gate-to-source voltage of the second transistor, the static state indicator is set to a first logic value, and when the replica circuit is in the evaluation configuration and the gate-to-source voltage of the first transistor is not greater than the gate-to-source voltage of the second transistor, the static state indicator is set to a second logic value. In yet another embodiment, in an integrated circuit having a digital logic circuit with a first transistor and a second transistor, and a replica circuit with a first transistor and a second transistor which replicate the first transistor and second transistor of the digital logic circuit, a method includes, during a high power mode, providing a run mode signal to an input of the digital logic circuit and an input of the replica circuit; during a low power mode, providing a static state indicator instead of the run mode signal to the input of the digital logic circuit and the input of the replica circuit, wherein when the replica circuit is configured into an ageing configuring, the first transistor and second transistor of the replica circuit experience a same stress as the first transistor and second transistor of the digital logic circuit, and wherein when the replica circuit is configured into an evaluation configuration, a threshold voltage of the first transistor of the replica circuit is compared to threshold voltage of the second transistor, and a result of the comparison is stored in storage circuitry as the static state indicator. In one aspect of this yet another embodiment, when the replica circuit is configured into the ageing configuration, the replica circuit provides a first same input to control electrodes of both the first transistor of the digital logic circuit and the first transistor of the replica circuit and provides a second same input to control electrodes of both the second transistor of the digital logic circuit and the second transistor of the replica circuit. In a further aspect, when the replica circuit is in the evaluation configuration and the threshold voltage of the first transistor is greater than the threshold voltage of the second transistor, the static state indicator is stored as a first logic value, and when the replica circuit is in the evaluation configuration and the threshold voltage of the first transistor is not greater than the threshold voltage of the second transistor, the static state indicator is stored as a second logic value. In another aspect, when in the evaluation configuration, the first and second transistor are isolated from the input of the replica circuit while the threshold voltages of the first and second transistors of the replica circuit are being compared. In a further aspect, when the replica circuit is in the ageing configuration during the low power mode: the first transistor of the replica circuit and the first transistor of the digital logic circuit experience stress if the static state indicator has a first logic value and are relaxed if the static state indicator has a second logic value, different from the first logic value, and the second transistor of the replica circuit and the second transistor of the digital logic circuit experience stress if the static state indicator has the second logic value, and are relaxed if the static state indicator has the first logic value. In another aspect, the method further includes during the high power mode, providing a clock signal as the run mode signal to the input of the digital logic circuit and the input of the replica circuit.

What is claimed is:
1. An integrated circuit, comprising:
a digital logic circuit having a first transistor and a second transistor;
a replica circuit having a first transistor and a second transistor which replicate the first transistor and second transistor of the digital logic circuit;
a storage circuit configured to store a static state indicator;
a comparison circuit configured to compare threshold voltages of the first and second transistor of the replica circuit, and having an output coupled to provide the static state indicator to the storage circuit; and
a selection circuit configured to provide the state indicator to an input of the digital logic circuit and an input of the replica circuit during a lower power mode and to provide a run mode signal instead of the state indicator to the input of the digital logic signal and the input of the replica circuit during a high power mode.

2. The integrated circuit of claim 1, wherein the replica circuit is configured to operate in an evaluation configuration and an ageing configuration, wherein when in the evaluation configuration, the first and second transistor are isolated from the input of the replica circuit and the comparison circuit compares the threshold voltages of the first and second transistors.

3. The integrated circuit of claim 2, wherein when the replica circuit is in the evaluation configuration and the threshold voltage of the first transistor is greater than the threshold voltage of the second transistor, the static state indicator is set to a first logic value, and when the replica circuit is in the evaluation configuration and the threshold voltage of the first transistor is not greater than the threshold voltage of the second transistor, the static state indicator is set to a second logic value.

4. The integrated circuit of claim 2, wherein when the replica circuit is in the ageing configuration, the replica circuit provides a first same input to control electrodes of both the first transistor of the digital logic circuit and the first transistor of the replica circuit and provides a second same input to control electrodes of both the second transistor of the digital logic circuit and the second transistor of the replica circuit.

5. The integrated circuit of claim 4, wherein when the replica circuit is in the ageing configuration, the first transistor and second transistor of the replica circuit are decoupled from the comparison circuit.

6. The integrated circuit of claim 4, wherein, when the replica circuit is in the ageing configuration during the low power mode:
the first transistor of the replica circuit and the first transistor of the digital logic circuit experience stress if the static state indicator has a first logic value and are relaxed if the static state indicator has a second logic value, different from the first logic value, and
the second transistor of the replica circuit and the second transistor of the digital logic circuit experience stress if the static state indicator has the second logic value, and are relaxed if the static state indicator has the first logic value.

7. An integrated circuit, comprising:
a digital logic circuit having a first transistor and a second transistor;
a replica circuit having a first transistor and a second transistor which replicate the first transistor and second transistor of the digital logic circuit, and a plurality of switches, wherein the replica circuit is configured into an evaluation configuration when the plurality of switches are in a first configuration and an ageing configuration when the plurality of switches are in a second configuration;
a storage circuit configured to store a static state indicator;
a comparison circuit having a first input coupled to the first transistor of the replica circuit, a second input coupled to the second transistor of the replica circuit, and an output coupled to provide the static state indicator to the storage circuit; and
a multiplexer (MUX) having a first data input, a second data input, a control input, and an output, wherein the output is coupled to an input of the digital logic circuit and an input of the replica circuit, the first data input signal is coupled to receive the static state indicator and the second data input is coupled to receive a clock signal, wherein the MUX is configured to provide the first data input as the output of the MUX during a low power mode and to provide the second data input as the output of the MUX during a high power mode.

8. The integrated circuit of claim 7, wherein:
the digital logic circuit comprises a chain of series-connected inverters, wherein a first inverter of the series-connected inverters includes the first transistor of the digital logic circuit and a second inverter of the series-connected inverters includes the second transistor of the digital logic circuit, and
the replica circuit includes a first inverter which includes the first transistor of the replica circuit and a second inverter which includes the second transistor of the replica circuit.

9. The integrated circuit of claim 8, wherein the output of the MUX is coupled to an input of the first inverter of the digital logic circuit, and an output of the first inverter of the digital logic circuit is coupled to an input of the second inverter of the digital logic circuit.

10. The integrated circuit of claim 9, wherein in the ageing configuration, the first inverter of the replica circuit is coupled to receive a first same value as the first inverter of the digital logic circuit, and the second inverter of the replica circuit is coupled to receive a same second value as the second inverter of the digital logic circuit.

11. The integrated circuit of claim 10, wherein in the ageing configuration, the replica circuit further comprises:
a third inverter and a fourth inverter, coupled in series, between the input of the replica circuit and the input of the first inverter of the replica circuit; and
a fifth and sixth inverter, coupled in series, between an output of the first inverter of the replica circuit and an input of the second inverter of the replica circuit.

12. The integrated circuit of claim 11, wherein in the evaluation configuration, the third and fourth inverters are decoupled from the first inverter of the replica circuit, and the fifth and sixth inverters are decoupled from the second inverter of the replica circuit, and in the ageing configuration, the comparison circuit is decoupled from the first and second transistor of the replica circuit.

13. The integrated circuit of claim 7, wherein in the evaluation configuration, the comparison circuit is configured to compare gate-to-source voltages of the first and second transistor of the replica circuit, and provide a result of the comparison as the static state indicator in the storage circuit.

14. The integrated circuit of claim 13, wherein when the replica circuit is in the evaluation configuration and the gate-to-source voltage of the first transistor is greater than the gate-to-source voltage of the second transistor, the static state indicator is set to a first logic value, and when the replica circuit is in the evaluation configuration and the gate-to-source voltage of the first transistor is not greater than the gate-to-source voltage of the second transistor, the static state indicator is set to a second logic value.

15. In an integrated circuit having a digital logic circuit with a first transistor and a second transistor, and a replica circuit with a first transistor and a second transistor which replicate the first transistor and second transistor of the digital logic circuit, a method comprises:
during a high power mode, providing a run mode signal to an input of the digital logic circuit and an input of the replica circuit;
during a low power mode, providing a static state indicator instead of the run mode signal to the input of the digital logic circuit and the input of the replica circuit, wherein when the replica circuit is configured into an ageing configuring, the first transistor and second transistor of the replica circuit experience a same stress as the first transistor and second transistor of the digital logic circuit, and wherein when the replica circuit is configured into an evaluation configuration, a threshold voltage of the first transistor of the replica circuit is compared to threshold voltage of the second transistor, and a result of the comparison is stored in storage circuitry as the static state indicator.

16. The method of claim 15, wherein when the replica circuit is configured into the ageing configuration, the replica circuit provides a first same input to control electrodes of both the first transistor of the digital logic circuit and the first transistor of the replica circuit and provides a second same input to control electrodes of both the second transistor of the digital logic circuit and the second transistor of the replica circuit.

17. The method of claim 16, wherein when the replica circuit is in the evaluation configuration and the threshold voltage of the first transistor is greater than the threshold voltage of the second transistor, the static state indicator is stored as a first logic value, and when the replica circuit is in the evaluation configuration and the threshold voltage of the first transistor is not greater than the threshold voltage of the second transistor, the static state indicator is stored as a second logic value.

18. The method of claim 15, wherein when in the evaluation configuration, the first and second transistor are isolated from the input of the replica circuit while the threshold voltages of the first and second transistors of the replica circuit are being compared.

19. The method of claim 18, wherein, when the replica circuit is in the ageing configuration during the low power mode:

the first transistor of the replica circuit and the first transistor of the digital logic circuit experience stress if the static state indicator has a first logic value and are relaxed if the static state indicator has a second logic value, different from the first logic value, and the second transistor of the replica circuit and the second transistor of the digital logic circuit experience stress if the static state indicator has the second logic value, and are relaxed if the static state indicator has the first logic value.

20. The method of claim 15, further comprising:

during the high power mode, providing a clock signal as the run mode signal to the input of the digital logic circuit and the input of the replica circuit.

* * * * *